(12) United States Patent
Belfroid et al.

(10) Patent No.: US 7,414,699 B2
(45) Date of Patent: Aug. 19, 2008

(54) LITHOGRAPHIC APPARATUS AND DEVICE MANUFACTURING METHOD

(75) Inventors: Stefan Philip Christiaan Belfroid, Delft (NL); Nicolaas Ten Kate, Almkerk (NL); Nicolaas Rudolf Kemper, Eindhoven (NL); Johannes Petrus Maria Smeulers, Zwijndrecht (NL); Arno Willem Frederik Volker, Delft (NL); Rene Breeuwer, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 611 days.

(21) Appl. No.: 10/986,186

(22) Filed: Nov. 12, 2004

(65) Prior Publication Data

US 2006/0103816 A1    May 18, 2006

(51) Int. Cl.
G03B 27/52 (2006.01)
G03B 27/42 (2006.01)
G03B 27/32 (2006.01)
G03C 5/00 (2006.01)

(52) U.S. Cl. .................... 355/30; 355/53; 355/77; 430/30

(58) Field of Classification Search ............ 355/30, 355/53, 72, 77; 430/30, 322
See application file for complete search history.

(56) References Cited

U.S. PATENT DOCUMENTS

| | | | |
|---|---|---|---|
| 3,573,975 A | 4/1971 | Dhaka et al. ............ 117/212 |
| 3,648,587 A | 3/1972 | Stevens .................. 95/44 |
| 4,346,164 A | 8/1982 | Tabarelli et al. ......... 430/311 |
| 4,390,273 A | 6/1983 | Loebach et al. ......... 355/125 |
| 4,396,705 A | 8/1983 | Akeyama et al. ........ 430/326 |
| 4,480,910 A | 11/1984 | Takanashi et al. ....... 355/30 |
| 4,509,852 A | 4/1985 | Tabarelli et al. ........ 355/30 |
| 5,040,020 A | 8/1991 | Rauschenbach et al. .. 355/53 |
| 5,610,683 A | 3/1997 | Takahashi .............. 355/53 |
| 5,715,039 A | 2/1998 | Fukuda et al. .......... 355/53 |
| 5,825,043 A | 10/1998 | Suwa .................... 250/548 |
| 5,900,354 A | 5/1999 | Batchelder ............. 430/395 |
| 6,191,429 B1 | 2/2001 | Suwa .................... 250/548 |
| 6,236,634 B1 | 5/2001 | Lee et al. .............. 369/112 |
| 6,560,032 B2 | 5/2003 | Hatano ................. 359/656 |
| 6,600,547 B2 | 7/2003 | Watson et al. |
| 6,603,130 B1 | 8/2003 | Bisschops et al. ...... 250/492.1 |
| 6,633,365 B2 | 10/2003 | Suenaga ............... 355/53 |
| 6,662,812 B1 * | 12/2003 | Hertz et al. ............ 134/1.3 |
| 7,014,966 B2 * | 3/2006 | Pawloski et al. ........ 430/30 |
| 2002/0020821 A1 | 2/2002 | Van Santen et al. ..... 250/492 |
| 2002/0163629 A1 | 11/2002 | Switkes et al. ......... 355/53 |

(Continued)

FOREIGN PATENT DOCUMENTS

DE    206 607    2/1984

(Continued)

OTHER PUBLICATIONS

U.S. Appl. No. 10/847,661, filed May 18, 2004, Streefkerk et al.

(Continued)

*Primary Examiner*—Alan A Mathews
(74) *Attorney, Agent, or Firm*—Pillsbury Winthrop Shaw Pittman, LLP

(57) ABSTRACT

In an immersion lithography apparatus, ultrasonic waves are used to atomize liquid on a surface of the substrate.

25 Claims, 3 Drawing Sheets

U.S. PATENT DOCUMENTS

| | | | |
|---|---|---|---|
| 2003/0123040 | A1 | 7/2003 | Almogy .................. 355/69 |
| 2003/0174408 | A1 | 9/2003 | Rostalski et al. ............ 359/642 |
| 2004/0000627 | A1 | 1/2004 | Schuster |
| 2004/0021844 | A1 | 2/2004 | Suenaga |
| 2004/0075895 | A1 | 4/2004 | Lin ............................ 359/380 |
| 2004/0109237 | A1 | 6/2004 | Epple et al. |
| 2004/0114117 | A1 | 6/2004 | Bleeker |
| 2004/0119954 | A1 | 6/2004 | Kawashima et al. .......... 355/30 |
| 2004/0125351 | A1 | 7/2004 | Krautschik .................. 355/53 |
| 2004/0135099 | A1 | 7/2004 | Simon et al. |
| 2004/0136494 | A1 | 7/2004 | Lof et al. |
| 2004/0160582 | A1 | 8/2004 | De Smit et al. |
| 2004/0165159 | A1 | 8/2004 | Lof et al. |
| 2004/0207824 | A1 | 10/2004 | Lof et al. |
| 2004/0211920 | A1 | 10/2004 | Derksen et al. |
| 2005/0024609 | A1* | 2/2005 | De Smit et al. ............... 355/18 |
| 2007/0132969 | A1* | 6/2007 | Gellrich et al. ............... 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

U.S. Appl. No. 10/823,777, filed Apr. 14, 2004, Kolesnychenko et al.
U.S. Appl. No. 10/698,012, filed Oct. 31, 2003, Flagello et al.
U.S. Appl. No. 10/743,271, filed Dec. 23, 2003, Van Santen et al.
U.S. Appl. No. 10/743,266, filed Dec. 23, 2003, Mulkens et al.
U.S, Appl. No. 10/719,683, filed Nov. 24, 2003, Streefkerk et al.
U.S. Appl. No. 10/367,910, filed Feb. 19, 2003, Suwa et al.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).

* cited by examiner

_US 7,414,699 B2_

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in and out-lets positioned around the final element are possible, one example is illustrated in FIG. 3 in which four sets of an inlet with an outlet on either side are provided in a regular pattern around the final element.

In a lithographic apparatus that confines immersion liquid, such as water, to only a localized area between the projection system and the substrate, problems may be caused by any liquid left behind on the substrate after the projection system and liquid supply system have passed (from the point of view of the substrate). For example, liquid left on the substrate surface may evaporate causing localized cooling of the substrate which can lead to thermal distortion of the substrate. Humid gas resulting from such evaporation may affect the results of interferometric displacement measuring systems commonly used to monitor the position of the substrate table.

SUMMARY

Accordingly, it would be advantageous, for example, to provide an approach to removal of residual liquid from the substrate in an immersion lithography apparatus.

According to an aspect of the invention, there is provided a lithographic projection apparatus arranged to project a pattern from a patterning device onto a substrate through a liquid provided in a space adjacent the substrate, the apparatus comprising an ultrasonic transducer configured to emit an ultrasonic beam toward the substrate to atomize liquid theron.

According to an aspect of the invention, there is provided a lithographic projection apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate;

a liquid supply system configured to at least partly fill a space between the projection system and the substrate with a liquid, the liquid supply system providing the liquid onto the substrate; and an ultrasonic transducer configured to emit an ultrasonic beam toward the substrate to atomize liquid thereon.

According to an aspect of the invention, there is provided a device manufacturing method, comprising:

projecting a patterned beam of radiation onto a substrate through a liquid provided in a space adjacent the substrate; and projecting an ultrasonic beam toward the substrate to atomize liquid thereon.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
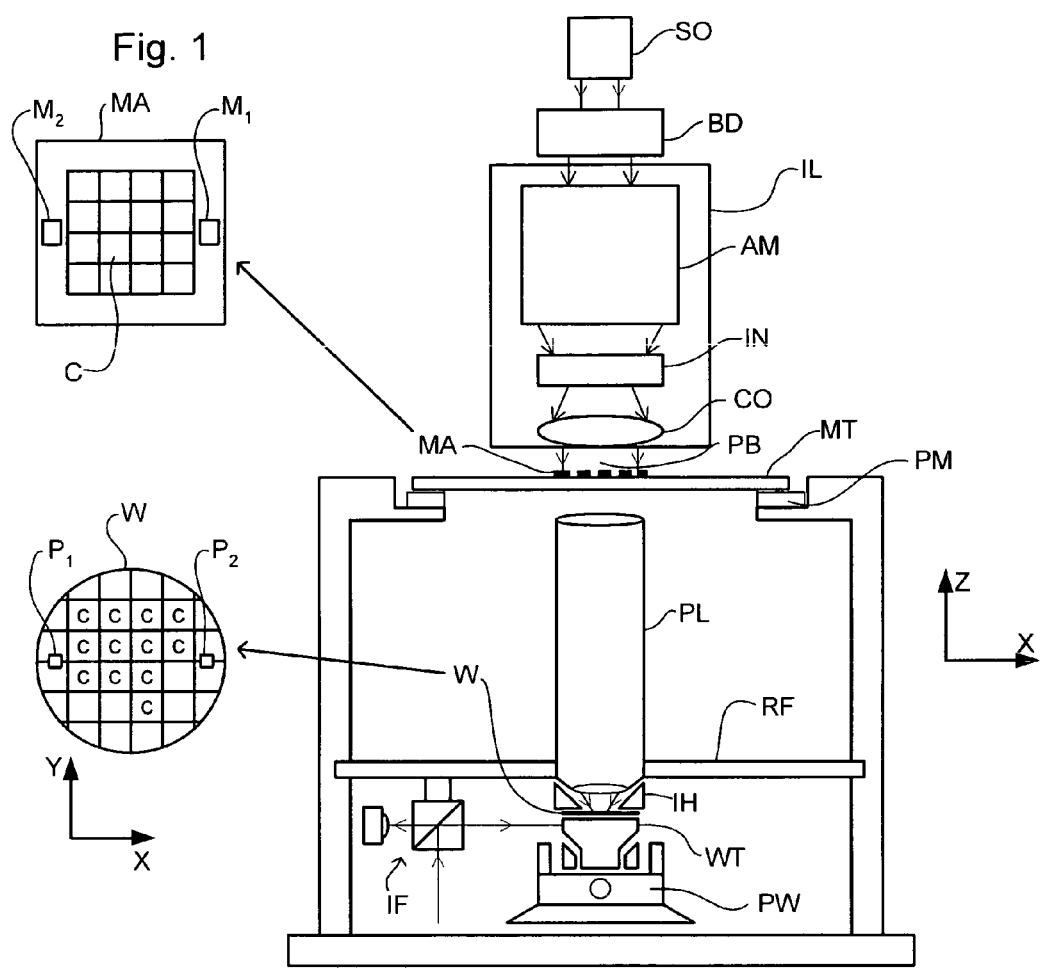
FIG. 1 depicts a lithographic apparatus according to an embodiment of the invention.
Figure 2:
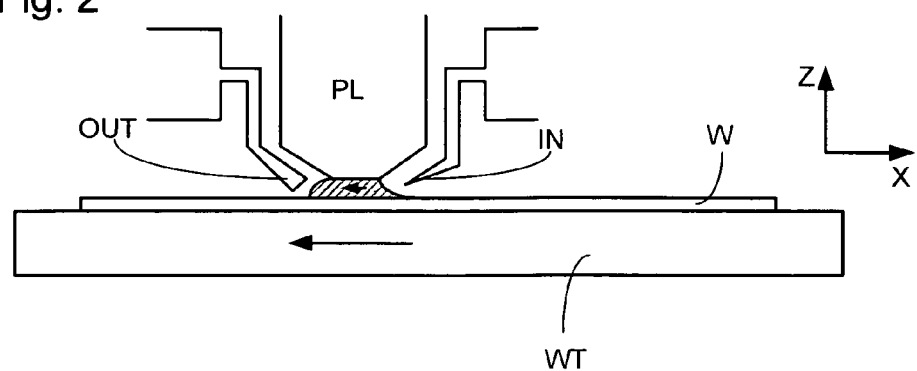
FIGS. 2 and 3 depict a liquid supply system for use in a lithographic projection apparatus.
Figure 3:
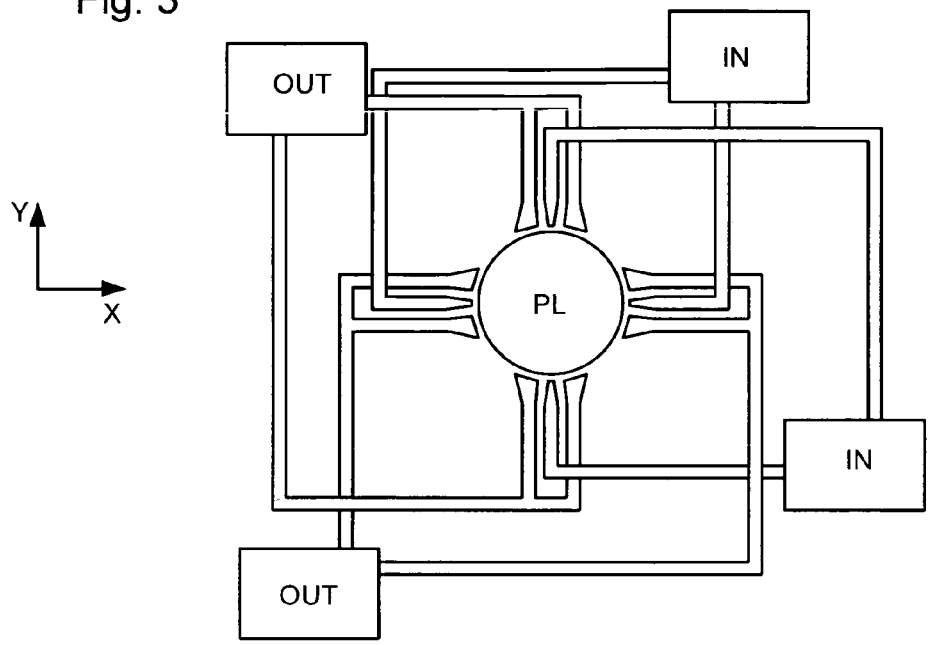

FIG. 1 schematically depicts a lithographic apparatus according to one embodiment of the invention. The apparatus comprises:

- an illumination system (illuminator) IL configured to condition a radiation beam PB. (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
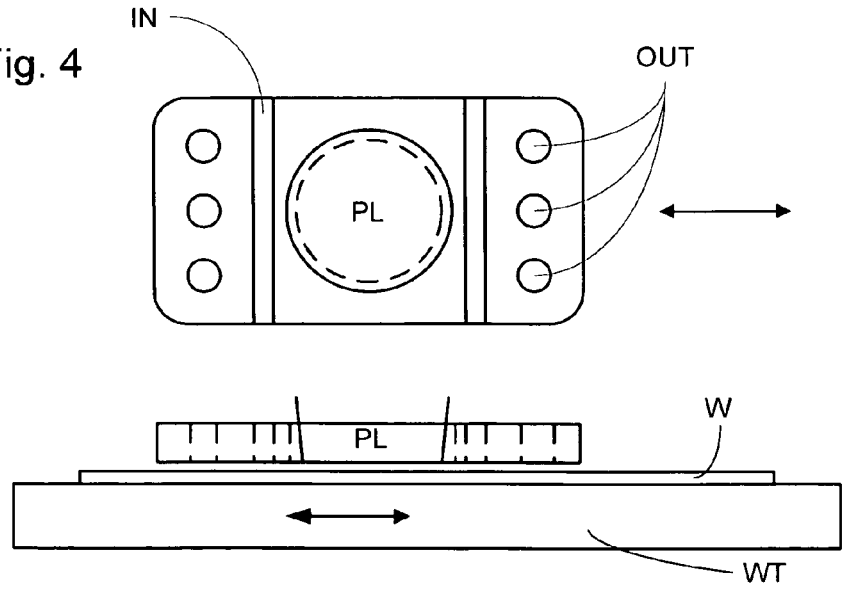
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
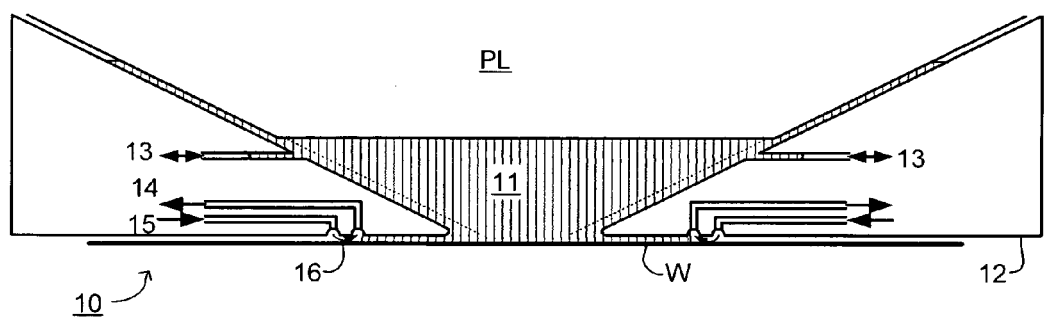
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. It will be understood by the person skilled in the art that other types of seal could be used to contain the liquid.

Figure 6:
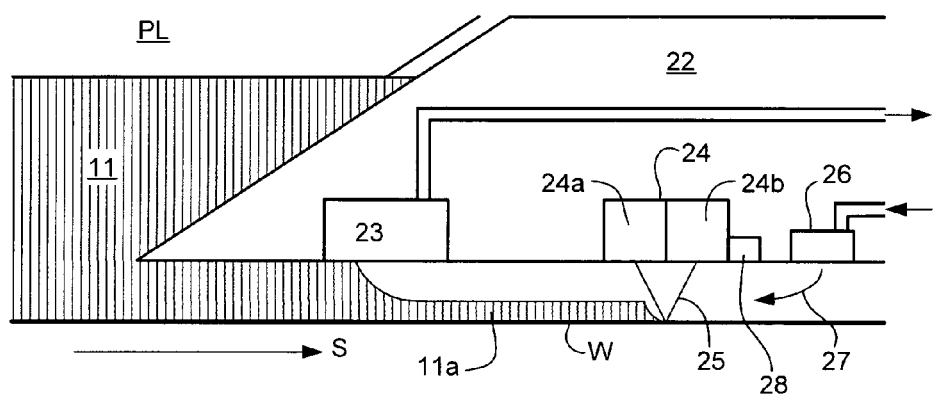
FIG. 6 depicts a liquid supply system according to an embodiment of the invention.

FIG. 6 shows a liquid supply system IH according to an embodiment of the invention. The liquid supply system comprises a liquid confinement structure 22 which confines liquid 11 to a space between the final element of the projection system PL and the substrate W. The liquid confinement structure 22 is borne a small distance, e.g. 50 to 300 µm, above the substrate and has a seal device 23 to restrict outflow of the liquid 11. This may be a gas or liquid seal, using a flow of gas or liquid to confine the liquid 11, and may also act as a bearing for the liquid confinement structure which alternatively may be separately supported and/or actuated. The seal device may simply be a low pressure extraction port to suck away liquid flowing under the liquid confinement structure 22.

Since it is typically difficult to make the seal device perfectly effective, it is likely that a thin film of liquid 11a, perhaps of the order of 10 µm thick, will be left behind as the substrate moves (e.g., scans) in the direction of the arrow S. (The relative height of this film is exaggerated in FIG. 6 for clarity). To remove this film, an ultrasonic transducer 24 is provided on the lower surface of the liquid confinement structure 22.

The ultrasonic transducer 24 emits an ultrasonic beam 25 with a frequency, in an embodiment, in excess of 1 MHz and potentially as high as 50 MHz through the gas (e.g., air) present under the liquid confinement structure 22 and onto the substrate. The ultrasonic beam 25 atomizes the liquid layer 11a and frees the liquid from the surface of the substrate. The liquid is removed substantially without cooling of the substrate, by atomization and transportation of the atomized liquid. Evaporation, as does occur, will likely not directly affect the substrate. A flow of gas (e.g. air) 27 may be provided by gas supply 26 to carry the atomized liquid toward the seal device 23 and prevent it from escaping to parts of the apparatus where it may be undesirable. An extractive part of the seal device 23 may set up sufficient gas flow to perform this function in one or more embodiments of the invention.

In an embodiment, the ultrasonic transducer 24 is formed by two separately driven parts 24a, 24b. The relative phases of these parts may be controlled to focus the ultrasonic beam at the surface of the liquid layer 11a. A sensor 28, e.g. a an acoustic or optical sensor, may be provided to detect the presence of liquid layer 11a and/or the position of its top surface. Additionally or alternatively, the sensor 28 may be used to control the amplitude, frequency and/or phase of the two parts 24a, 24b of the ultrasonic transducer to ensure efficient and effective removal of the liquid layer without excessive heat generation and to control the size of the liquid droplets generated, which may be a function of frequency of the ultrasonic beam. Interference effects between beams emitted by the two parts of the transducer may be exploited to enhance atomization. Harmonics of the principal frequency may be used to enhance the removal effect. Although several tens of Watts of power may be input to the transducer per cm$^2$ of substrate where liquid is to be removed, the frequency of the ultrasonic beam(s) is sufficiently high not to disturb the lithographic apparatus.

Suitable types of transducers include piezo-electric, piezo-strictive, magneto-strictive and capacitive transducers. Multiple transducers may be spaced around the liquid confinement structure 22 according to its geometry and the expected directions of movement of the substrate. Interdigitated transducers may be used and several concentric rings of transducers may be used if required.

In place of a sensor to detect the liquid layer 11a, the impedance of the transducer(s) may be monitored as proper coupling of the ultrasonic beam 25 into the liquid layer 11a will cause a change of impedance in the transducer 24.

In European Patent Application No. 03257072.3, the idea of a twin or dual stage immersion lithography apparatus is disclosed. Such an apparatus is provided with two tables for supporting a substrate. Leveling measurements are carried out with a table at a first position, without inversion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate through a liquid provided in a space adjacent the substrate, the apparatus comprising an ultrasonic transducer configured to emit an ultrasonic beam having a frequency of about 1 MHz or greater toward the substrate to atomize liquid thereon and free the liquid from the substrate.

2. The apparatus according to claim 1, wherein the ultrasonic transducer is configured to emit the ultrasonic beam into a gaseous medium.

3. The apparatus according to claim 1, wherein the ultrasonic transducer comprises two independently driven parts.

4. The apparatus according to claim 3, wherein the two parts of the transducer are configured to emit beams that interfere at or near the surface of the substrate.

5. The apparatus according to claim 1, comprising two ultrasonic transducers spaced apart in a direction substantially parallel to a periphery of the space.

6. The apparatus according to claim 1, comprising two ultrasonic transducers spaced apart in a direction substantially radial to the space.

7. The apparatus according to claim 1, wherein the ultrasonic transducer is configured to emit an ultrasonic beam having a frequency in the range of 1 to 50 MHz.

8. The apparatus according to claim 1, wherein the ultrasonic transducer is of a type selected from the group comprising piezo-electric, piezo-strictive, magneto-strictive and capacitive transducers.

9. The apparatus according to claim 1, further comprising:
   a sensor configured to detect the liquid on a surface of the substrate; and a control system configured to control the amplitude, frequency, phase, or any combination of the foregoing, of the ultrasonic beam in response to an output of the sensor.

10. The apparatus according to claim 1, further comprising:
a sensor configured to detect an impedance of the transducer; and
a control system configured to control the amplitude, frequency, phase, or any combination of the foregoing, of the ultrasonic beam in response to an output of the sensor.

11. A lithographic projection apparatus, comprising:
an illuminator configured to condition a radiation beam;
a support constructed to hold a patterning device, the patterning device configured to impart the radiation beam with a pattern in its cross-section to form a patterned radiation beam;
a substrate table constructed to hold a substrate;
a projection system configured to project the patterned radiation beam onto a target portion of the substrate;
a liquid supply system configured to at least partly fill a space between the projection system and the substrate with a liquid, the liquid supply system configured to provide the liquid onto the substrate; and
an ultrasonic transducer configured to emit an ultrasonic beam toward the substrate to atomize liquid thereon and free the liquid from the substrate while liquid is retained in the space between the projection system and the substrate.

12. The apparatus according to claim 11, wherein the ultrasonic transducer is configured to emit the ultrasonic beam into a gaseous medium.

13. The apparatus according to claim 11, wherein the ultrasonic transducer forms part of the liquid supply system and comprises two independently driven parts.

14. The apparatus according to claim 11, wherein ultrasonic transducer is configured to emit beams that interfere at or near the surface of the substrate.

15. The apparatus according to claim 11, wherein the ultrasonic transducer is configured to emit an ultrasonic beam having a frequency in the range of 1 to 50 MHz.

16. The apparatus according to claim 11, further comprising:
a sensor configured to detect the liquid on a surface of the substrate; and
a control system configured to control the amplitude, frequency, phase, or any combination of the foregoing, of the ultrasonic beam in response to an output of the sensor.

17. The apparatus according to claim 11, further comprising:
a sensor configured to detect an impedance of the transducer; and
a control system configured to control the amplitude, frequency, phase, or any combination of the foregoing, of the ultrasonic beam in response to an output of the sensor.

18. A device manufacturing method, comprising:
projecting a patterned beam of radiation onto a substrate through a liquid provided in a space adjacent the substrate; and
projecting an ultrasonic beam toward the substrate to atomize liquid thereon and free the liquid from the substrate while keeping liquid in the space adjacent the substrate.

19. The method according to claim 18, comprising projecting the ultrasonic beam into a gaseous medium.

20. The method according to claim 18, comprising projecting two ultrasonic beams that interfere at or near the surface of the substrate.

21. The method according to claim 18, comprising projecting ultrasonic beams from two ultrasonic transducers spaced apart in a direction substantially parallel to a periphery of the space.

22. The method according to claim 18, comprising projecting ultrasonic beams from two ultrasonic transducers spaced apart in a direction substantially radial to the space.

23. The method according to claim 18, wherein the ultrasonic beam has a frequency in the range of 1 to 50 MHz.

24. The method according to claim 18, further comprising:
detecting the liquid on a surface of the substrate; and
controlling the amplitude, frequency, phase, or any combination of the foregoing, of the ultrasonic beam in response to detection of the liquid.

25. The method according to claim 18, further comprising:
detecting an impedance of a transducer used to create the ultrasonic beam; and
controlling the amplitude, frequency, phase, or any combination of the foregoing, of the ultrasonic beam in response to detection of the impedance.

* * * * *